United States Patent [19]
Weeks et al.

[11] Patent Number: 5,891,312
[45] Date of Patent: Apr. 6, 1999

[54] ENHANCED VACUUM ARC VAPOR DEPOSITION ELECTRODE

[75] Inventors: Jack L. Weeks, Scottsboro; Douglas M. Todd, Huntsville, both of Ala.

[73] Assignee: The United States of America as represented by the Administrator of the National Aeronautics and Space Administration, Washington, D.C.

[21] Appl. No.: 772,541

[22] Filed: Dec. 24, 1996

[51] Int. Cl.⁶ .................................................. C23C 14/00
[52] U.S. Cl. ................... 204/192.31; 204/298.05; 204/192.38; 204/298.41; 427/526; 427/531; 427/250; 427/580; 118/723 VE; 118/723 DC; 118/723 ER
[58] Field of Search ............ 204/192.17, 192.31, 204/298.05, 298.41, 192.15, 192.38; 427/569, 562, 576, 531, 455, 456, 564, 528, 250, 580; 118/723 ER, 723 VE, 723 DC, 723 IR

[56] References Cited

U.S. PATENT DOCUMENTS

| | | | |
|---|---|---|---|
| 4,863,581 | 9/1989 | Inokuti et al. | 204/192.31 |
| 5,013,578 | 5/1991 | Brown et al. | 427/455 |
| 5,380,415 | 1/1995 | Poorman et al. | 204/192.38 |

*Primary Examiner*—Thi Dang
*Attorney, Agent, or Firm*—Robert L. Broad, Jr.

[57] ABSTRACT

A process for forming a thin metal coating on a substrate wherein a gas stream heated by an electrical current impinges on a metallic target in a vacuum chamber to form a molten pool of the metal and then vaporize a portion of the pool, with the source of the heated gas stream being on one side of the target and the substrate being on the other side of the target such that most of the metallic vapor from the target is directed at the substrate.

9 Claims, 2 Drawing Sheets

ENHANCED VACUUM ARC VAPOR DEPOSITION ELECTRODE

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435, 42 U.S.C. 2457).

BACKGROUND OF THE INVENTION

1. Field of the Invention

This invention relates to the deposition of thin films of metal on substrates.

2. Prior Art

Vapor deposition of thin films of material on substrates is known. Generally, a welding torch of the type used in GTAW welding is used as the energy source for deposition of the metal film. An inert gas, such as argon, is passed through the torch with an electrical current sufficient to ionize the gas and form a plasma stream which is applied to a target made of a metal which is to be coated onto a substrate. The torch is mounted inside a vacuum chamber.

The plasma stream melts a pool of the target metal and then vaporizes a portion of the molten pool. Because of the vacuum applied to the chamber, the vapor from the target material flows outward from the target and forms a film on the substrate.

In a conventional vapor deposition process, the torch is placed directly over the target metal, as illustrated in U.S. Pat. No. 5,380,415, and the plasma directed onto the target metal, with the substrate to be coated being positioned to one side of the target. The disadvantage of this process is that the vapor flows outwardly from the target in all directions. While this might be the best method for coating the inside of a ring or cylinder, it does not work so well for other substrates.

SUMMARY OF THE INVENTION

Method and apparatus for vapor deposition of a film on a substrate utilizing a hollow tungsten electrode of a modified tungsten arc welding torch through which an inert gas flows so that an arc may be struck between the electrode and a target or source of the metal to be deposited on the substrate, the torch and substrate being positioned in a vacuum chamber. When the arc is struck, a portion of the target is vaporized and this vapor, because of the higher pressure in the vicinity of the target due to the gas flow results in a pressure gradient between the target and the substrate, quickly flows toward the substrate. To insure that most of the vapor flows toward the substrate, rather than in all directions, the tip of the electrode, from where the arc originates, is positioned to one side of the target and the substrate is positioned on the other side. The angle of incidence of the plasma stream relative to the molten pool of the target is substantially equal to the angle, relative to the pool, at which the stream of vapor flows from the pool to the substrate. Thus, almost all of the vapor is directed toward the substrate.

DETAILED DESCRIPTION OF THE INVENTION

Figure 1:
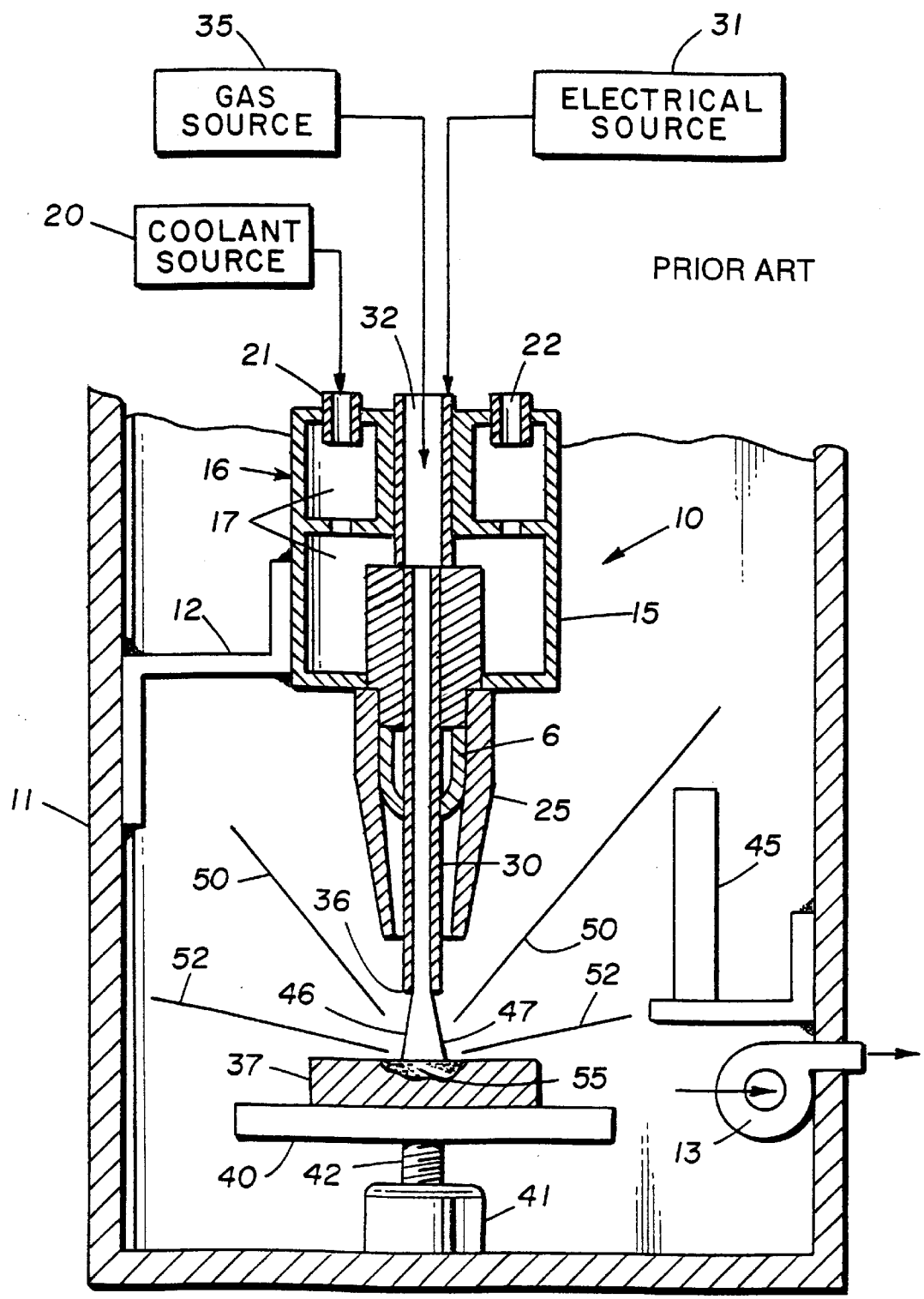
FIG. 1 is a schematic cross sectional view of a conventional apparatus for depositing a film of a metal in vapor form on a substrate.

Referring now in detail to the drawings, there is shown in FIG. 1 a conventional vapor deposition apparatus. This apparatus includes a modified gas tungsten arc welding torch 10 mounted within a closed vacuum chamber 11 which is connected to a vacuum pump 13, such as a turbomolecular pump, for drawing the pressure within the chamber down to a substantial vacuum in the range of 1 to 10 microns.

The torch 10 comprises a torch body 15 including a head 16 having a cooling chamber 17, the body being similar in construction to that disclosed in Poorman et al U.S. Pat. No. 5,380,415. Coolant, such as water, is fed from a coolant source 20 into the cooling chamber 17 through an inlet 21 and exits from the cooling chamber through an outlet 22.

Secured to the body 15 is a cup 25 formed from an electrical insulator material which carries a hollow collet body 26. Secured within the collet 26 is a cathode electrode 30, the electrode being in the form of an elongated hollow tube which is supplied with electrical power from a power supply 31 connected to an inlet 32 in the torch 10. The current supplied to the electrode is in the range 30 to 150 amps, with 100 amps being common.

Also communicating with the inlet 32 is an inert gas source 35. The gas, which is preferably any conventional inert gas used in GTAW welding, such as argon, flows through the inlet 32 and the hollow electrode to exit from a tip 36 of the electrode 30 to impinge on a target 37 made of a metallic or other electrically conductive material which is to form the coating.

The target 37 is supported on a base 40 which is positionable relative to the chamber 11 by moving the base 40 vertically relative to the tip 36 of the electrode. The vertical positioning of the target 37 can be changed by operating a drive motor 41 having a lead screw 42 which, when turned by the motor, raises or lowers the base 40 and the target 37. Thus, the spacing between the electrode tip 36 and the target 37 may be selectively varied in the range of 1 millimeter to 20 millimeters by operating the motor 41. It will be noted that the electrode 30 is positioned above the target 37 and the gas and electrical stream are orthogonal to the upper surface of the target 37.

A substrate 45 is positioned in the chamber 11 as shown in FIG. 1 near the pump 13. The substrate may be a glass or ceramic material or may be any material which is desired to be coated by a thin film of the target material.

When an arc is struck between the tip 36 of the electrode 30 and the target 37, the inert gas flowing from the electrode results in a significantly higher pressure in the vicinity of the target than at the surface of the substrate 45. Thus, as a portion of the target is melted to form a molten pool 55 and a portion of the pool vaporized by the heat of the arc, the metal vapor is quickly carried outwardly toward the substrate 45. The flow rate of the gas within the electrode is in the range of 0.1 cubic centimeters per second to 10 cubic centimeters per second measured at standard conditions, i.e. at one atmosphere and 20° C. This results in a typical gas pressure of approximately 500 microns at the molten surface of the target thereby resulting in a large pressure gradient between the target and the substrate. The gas velocity under these conditions is approximately sonic velocity and the gas rapidly carries the metal vapors to the substrate.

The structure described to this point is a conventional vapor deposition apparatus. In FIG. 1 the lines 46 and 47 show the general confines of the plasma stream extending from the tip 36 of the electrode 30 to the target 37. The lines 50 and 52 indicate generally the upper and lower confines of a major portion of the metal vapor flowing from the target. The flow path of the vapor is a figure of revolution in the sense that the path shown in FIG. 1 extends all around the axis of the electrode. Thus, most of the vapor is not directed toward the substrate 45 but is deposited on the walls of the chamber. This disadvantage is eliminated or substantially reduced in the invention disclosed below.

Figure 2:
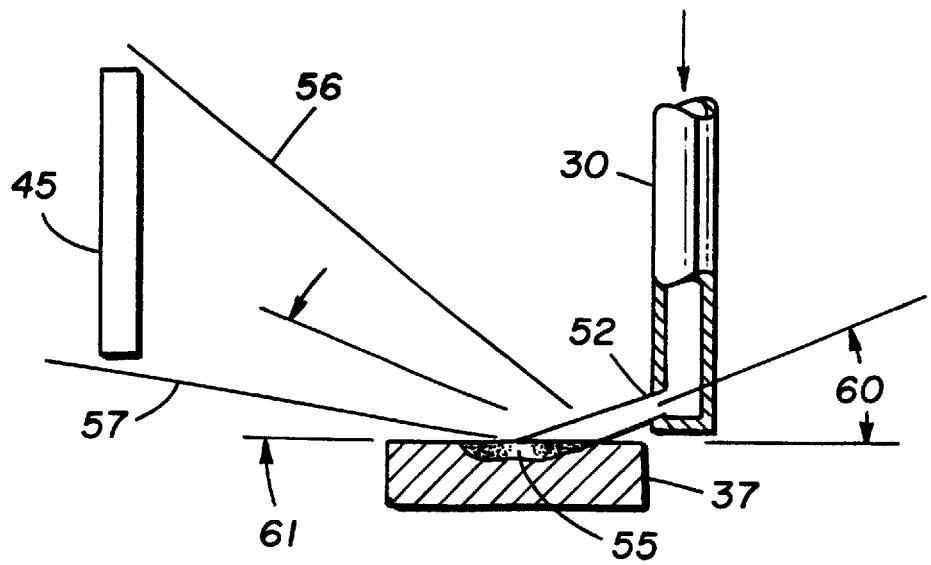
FIG. 2 is an enlarged schematic view showing the positioning of the torch, the target metal and the substrate to be coated in accordance with the principles of this invention.

FIG. 2 shows one embodiment of the invention. In this embodiment, the tip 36 of the electrode 30 is closed and the end of the electrode is provided with an opening 52 through the side of the electrode tip 36. The electrode is positioned to one side of the target 37 with the opening 52 facing the target. The ionized gas impinges on the upper surface of the target 37 to form a molten pool 55 of the metal and then vaporize metal from the upper surface of the pool. The substrate 45 is positioned on the other side of the target 37 such that a vertical plane through the pool 55 would pass through the electrode tip 36 and the central portion of the substrate 45. The lines 56 and 57 generally indicate the confines of the conical flow path of the vapor leaving the pool. The angle of incidence of the plasma stream on the pool 55, indicated by reference numeral 60 is generally equal to the angle, indicated by reference numeral 61, the axis of the conical flow vapor path makes with the surface of the pool. Thus, this structure aims most of the vapor directly at the substrate, so that most of the vapor is not used for coating the inner wall of the chamber 11 as in prior art apparatus.

Figure 3:
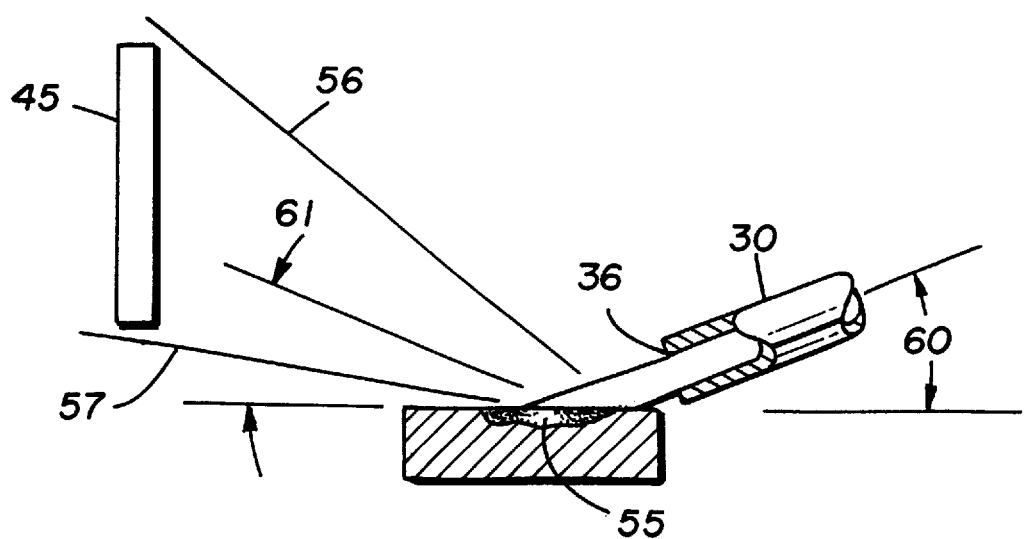
FIG. 3 is a view of the apparatus of FIG. 2 showing a different positioning of the torch.

FIG. 3 shows a second embodiment of the in invention. Here the end of the tip 36 of the electrode 30 is left open and the axis of the electrode is pointed at the pool of molten metal in the target. The results are the same as with the structure shown in FIG. 2.

What is claimed is:

1. A method of coating a film of a metal released from a source of said metal onto the surface of a substrate, comprising
   a. mounting said source and said substrate within an enclosed chamber;
   b. positioning a welding torch having a hollow electrode with a tip at a free end thereof within said chamber with said tip positioned adjacent to said source;
   c. feeding a gas through the hollow electrode along a first path to said source;
   d. applying electrical power to said electrode to form an arc between the tip of the electrode and said source to melt a portion of said source and form a pool of molten metal having a horizontal surface, said arc being sufficient to vaporize a portion of said molten metal to form a metal vapor;
   e. reducing the pressure within the chamber to a sub-atmospheric pressure such that the pressure at the substrate is less than the pressure at said source to cause the metal vapor to flow along a second path from the source to the substrate, said torch and said substrate being positioned on opposite sides of the source, said first and second paths meeting the horizontal surface of said pool at substantially the same angle.

2. The method of claim 1 wherein said first and second paths lie in a vertical plane extending through said source.

3. The method of claim 1 wherein the end of the electrode is closed and the gas is directed along the first path from an aperture in the side of the electrode.

4. The method of claim 1 wherein the metal vapor flow pattern along the second path defines a generally conical configuration having an apex at said source.

5. The method of claim 4 wherein the conical pattern has an apex angle within the range of 40° to 60°.

6. The method of claim 1 wherein the flow rate of the gas through said electrode is of a magnitude to create a gas pressure at said source which is greater than the pressure at the substrate to cause the metal vapors to flow from said source to said substrate.

7. The method of claim 6 wherein the velocity of the gas leaving said source is substantially sonic velocity.

8. The method of claim 7 wherein the pressure within the chamber is within the range of one to ten microns and the pressure at the source is approximately 500 microns.

9. Apparatus for coating a metal film by depositing metal vapors from a source of the metal onto a substrate spaced from said source, comprising:
   a. an enclosed chamber for containing the substrate and a source of said metal;
   b. a gas tungsten arc welding torch having a torch body mounted in the chamber;
   c. an elongated tubular tungsten electrode held by and electrically insulated from the torch body, said electrode having a tip extending from said torch body;
   d. support means for holding a source of the metal at a predetermined location in said chamber;
   e. the tip of said electrode being positioned on one side of said support means to direct a gas and an electrical current from said tip along a first path to the source to melt a portion of said source and form a molten pool of metal having a horizontal surface, said tip being positioned to one side and above said molten pool such that said first path is inclined at an angle to horizontal, and;
   f. means on the other side of said support means for holding a substrate having a target area to be coated, said holding means being positioned such that a second path leading from said molten pool to said target area is inclined at substantially the same angle as the first path.

\* \* \* \* \*